(12) United States Patent
Wang et al.

(10) Patent No.: US 11,102,035 B1
(45) Date of Patent: Aug. 24, 2021

(54) METHOD AND APPARATUS FOR ENVELOPE SHAPING OF MULTI-CARRIER SIGNAL IN ENVELOPE TRACKING TRANSMISSION

(71) Applicant: Telefonaktiebolaget LM Ericsson (publ), Stockholm (SE)

(72) Inventors: Zhancang Wang, Beijing (CN); Chen He, Beijing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/049,887

(22) PCT Filed: May 29, 2018

(86) PCT No.: PCT/CN2018/088834
§ 371 (c)(1),
(2) Date: Oct. 22, 2020

(87) PCT Pub. No.: WO2019/227305
PCT Pub. Date: Dec. 5, 2019

(51) Int. Cl.
*H04L 27/28* (2006.01)
*H04L 25/03* (2006.01)
(Continued)

(52) U.S. Cl.
CPC ...... *H04L 25/0384* (2013.01); *H04L 27/2272* (2013.01); *H04L 27/2614* (2013.01); *H04L 27/2647* (2013.01)

(58) Field of Classification Search
CPC ............. H04L 25/0384; H04L 27/2647; H04L 27/2272; H04L 27/2614
(Continued)

(56) References Cited

U.S. PATENT DOCUMENTS

| | | | |
|---|---|---|---|
| 9,859,845 B2 * | 1/2018 | Sarbishaei | H03F 1/0222 |
| 2013/0049858 A1 * | 2/2013 | Wimpenny | H03F 3/68 |
| | | | 330/84 |

(Continued)

FOREIGN PATENT DOCUMENTS

WO 2016081250 A1 5/2016

OTHER PUBLICATIONS

International Search Report dated Feb. 18, 2019 for International Application No. PCT/CN2018/088834 filed on May 29, 2018, consisting of 7-pages.

(Continued)

*Primary Examiner* — Don N Vo
(74) *Attorney, Agent, or Firm* — Christopher & Weisberg. P.A.

(57) ABSTRACT

A method and an apparatus for envelope shaping of a multi-carrier signal in envelope tracking transmission are disclosed. According to an embodiment, a baseband version of an envelope portion belonging to each of multiple carriers in the multi-carrier signal is positioned such that a frequency spacing between adjacent positioned envelope portions is smaller than that between corresponding adjacent carriers. The positioned envelope portions are combined into a composite envelope. The composite envelope is shaped. The shaped composite envelope is split into baseband versions of shaped envelope portions belonging to the multiple carriers. The baseband versions of each shaped envelope portion is repositioned such that a frequency spacing between adjacent repositioned envelope portions is equal to that between corresponding adjacent carriers.

20 Claims, 9 Drawing Sheets

(51) Int. Cl.
*H04L 27/227* (2006.01)
*H04L 27/26* (2006.01)

(58) Field of Classification Search
USPC .......................................... 375/259, 260, 350
See application file for complete search history.

(56) References Cited

U.S. PATENT DOCUMENTS

| | | | |
|---|---|---|---|
| 2014/0269986 A1* | 9/2014 | Nagode | H04B 1/0475 375/296 |
| 2014/0362951 A1 | 12/2014 | Fehri et al. | |
| 2015/0123735 A1 | 5/2015 | Wimpenny | |

OTHER PUBLICATIONS

Jinsung Choi et al; A Polar Transmitter with CMOS Programmable Hysteretic-Controlled Hybrid Switching Supply Modulator for Multistandard Applications; IEEE Transactions on Microwave Theory and Techniques; Jul. 2009; pp. 1675-1686; vol. 57, No. 7; consisting of 12-pages.

Muhammad Hassan et al; A Wideband CMOS/GaAs HBT Envelope Tracking Power Amplifier for 4G LTE Mobile Terminal Applications; IEEE Transactions on Microwave Theory and Techniques; May 2012; pp. 1321-1330; vol. 60, No. 5; consisting of 10-pages.

Feipeng Wang et al; Design of Wide-Bandwidth Envelope-Tracking Power Amplifiers for OFDM Applications; IEEE Transactions on Microwave Theory and Techniques; Apr. 2005; pp. 1244-1255; vol. 53, No. 4; ; consisting of 12-pages.

Dongsu Kim et al; Optimization for Envelope Shaped Operation of Envelope Tracking Power Amplifier; IEEE Transactions on Microwave Theory and Techniques; Jul. 2011; pp. 1787-1795; vol. 59, No. 7; consisting of 9-pages.

Jinseong Jeong et al; Wideband Envelope Tracking Power Amplifier with Reduced Bandwidth Power Supply Waveform; University of California at San Diego, La Jolla, California; 2009; consisting of 4-pages.

* cited by examiner

METHOD AND APPARATUS FOR ENVELOPE SHAPING OF MULTI-CARRIER SIGNAL IN ENVELOPE TRACKING TRANSMISSION

CROSS-REFERENCE TO RELATED APPLICATIONS

This application is a Submission Under 35 U.S.C. § 371 for U.S. National Stage Patent Application of International Application Number: PCT/CN2018/088834, filed May 29, 2018, entitled "METHOD AND APPARATUS FOR ENVELOPE SHAPING OF MULTI-CARRIER SIGNAL IN ENVELOPE TRACKING TRANSMISSION," the entirety of which is incorporated herein by reference.

TECHNICAL FIELD

Embodiments of the disclosure generally relate to wireless communication, and, more particularly, to a method and an apparatus for envelope shaping of a multi-carrier signal in envelope tracking transmission.

BACKGROUND

This section introduces aspects that may facilitate better understanding of the present disclosure. Accordingly, the statements of this section are to be read in this light and are not to be understood as admissions about what is in the prior art or what is not in the prior art.

The efficiency of a radio frequency (RF) power amplifier (PA) is generally defined as a ratio between a desired transmitted radio power and a total power from a power supply. This ratio appears to be rather low in the future wideband applications if traditional architectures are still applied. For the purpose of enhancing the efficiency, an envelope tracking (ET) technique has been proposed and utilized in the wireless communication infrastructure industry and has been considered as a most promising efficiency enhancement solution for the fifth generation (5G) and beyond wireless communications. The most important advantage of an ET PA compared to a Doherty PA is the potential to realize direct broadband or concurrent multiband performance.

In an ET PA, the power supply voltage applied to the PA is constantly adjusted according to the envelope version of an original input signal to ensure that the PA is operating at the peak efficiency over the output power range. However, when the PA power supply is changed from low to high instantaneously and dynamically or vice-versa, the PA operating condition on the drain-side would change dramatically accordingly. This significant change of the PA operating point would give rise to undesirable distortions and memory effects, which may cause gain collapse and unpredictable and non-correctable distortions and adversely affect both efficiency and linearity of an ET PA system.

The supply modulator for an ET PA is a dynamic power supply in which the supply varies as a function of the envelope to maintain the PA operating near saturation, but with a high-efficiency region. The optimum slope can change in the vicinity of the minimum power region in ET, as an additional offset voltage. The offset voltage in the low power region is typically adjusted to be greater than the knee voltage of the PA because when the supply voltage to the PA is lower than the knee voltage, the nonlinear output capacitance will increase suddenly and the PA exhibits strong nonlinear amplitude-to-amplitude conversion (AM-AM) and amplitude-to-phase conversion (AM-PM) distortions. To solve this problem, envelope shaping de-trough has been proposed, which ensures the supply voltage is greater than the knee voltage. A shaped envelope input to the supply modulator can prevent the gain collapse and phase distortions of the PA at a low-power levels. Therefore, to prevent the collapse of gain and minimize sensitivity to timing mismatch in the ET PA, shaping functions used to avoid knee region operation are called de-trough.

Envelope shaping can be viewed as if a certain envelope spectrum is added to the original envelope spectrum of isolated carriers just covering the instantaneous bandwidth (IBW) of the carriers. The tolerated spectrum inside the desired transmission band is usually larger than the unwanted spectrum outside the carriers. Some examples of this can be found in the telecom standards defined by 3GPP. Unwanted emissions are defined via specified allowed levels in certain frequency ranges, by adjacent channel leakage power ratio (ACLR), and via a spectrum mask, both defined just outside the channel bandwidth of the carriers. Inside the carriers, the unwanted emission requirement is often converted into an EVM that must be below a certain limit.

Orthogonal frequency division multiplexing (OFDM) is widely regarded as the key underlying air interface technology for wireless systems such as worldwide interoperability for microwave access (WiMAX), 3rd generation partnership project (3GPP) long term evolution (LTE), 3GPP2 ultra mobile broadband (UMB), digital video broadcasting (DVB), and wireless local area network (WLAN). Due to the inherent nature of these technologies, OFDM signals have high peak to average power ratio (PAPR) that adversely impacts the efficiency of PAs used in both wireless base stations and user equipments.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved solution for envelope shaping of a multi-carrier signal in envelope tracking transmission.

According to one aspect of the disclosure, there is provided a method for envelope shaping of a multi-carrier signal in envelope tracking transmission. The method comprises positioning a baseband version of an envelope portion belonging to each of multiple carriers in the multi-carrier signal such that a frequency spacing between adjacent positioned envelope portions is smaller than that between corresponding adjacent carriers. The method further comprises combining the positioned envelope portions into a composite envelope. The method further comprises shaping the composite envelope. The method further comprises splitting the shaped composite envelope into baseband versions of shaped envelope portions belonging to the multiple carriers. The method further comprises repositioning the baseband version of each shaped envelope portion such that a frequency spacing between adjacent repositioned envelope portions is equal to that between corresponding adjacent carriers.

In an embodiment of the disclosure, the method further comprises filtering the baseband version of each shaped envelope portion before the repositioning thereof.

In an embodiment of the disclosure, the method further comprises determining whether the filtered baseband version of each shaped envelope portion satisfies a predetermined envelope shaping level. When it is determined that the filtered baseband version of a shaped envelope portion does not satisfy the predetermined envelope shaping level, the positioning, the combining, the shaping, the splitting, the filtering and the determining are performed iteratively until it is determined that the filtered baseband version of each shaped envelope portion satisfies the predetermined envelope shaping level.

In an embodiment of the disclosure, the baseband version of each envelope portion is positioned with a first predetermined frequency spacing.

In an embodiment of the disclosure, the first predetermined frequency spacing is set to prevent third order intermodulation products due to the shaping from falling inside frequency ranges of the positioned envelope portions.

In an embodiment of the disclosure, the composite envelope is a baseband version centered at zero frequency or a value near zero frequency.

In an embodiment of the disclosure, the baseband version of each shaped envelope portion is filtered by converting the baseband version of the shaped envelope portion from time domain into frequency domain, filtering out envelope shaping distortion outside the bandwidth of the shaped envelope portion in frequency domain, adding filtered envelope shaping distortion to the base band version of the shaped envelope portion in frequency domain, and converting the baseband version of the shaped envelope portion from frequency domain into time domain.

In an embodiment of the disclosure, the positioning and the repositioning are performed by complex numerically controlled oscillator (NCO) multiplication. The combining is performed by complex addition of the positioned envelope portions.

In an embodiment of the disclosure, the method further comprises recombining the repositioned envelope portions into a target composite envelope. The method further comprises converting the target composite envelope to a target analog envelope through digital to analog conversion.

According to another aspect of the disclosure, there is provided an apparatus for envelope shaping of a multi-carrier signal in envelope tracking transmission. The apparatus comprises a frequency positioner configured to position a baseband version of an envelope portion belonging to each of multiple carriers in the multi-carrier signal such that a frequency spacing between adjacent positioned envelope portions is smaller than that between corresponding adjacent carriers. The apparatus further comprises an envelope combiner configured to combine the positioned envelope portions into a composite envelope. The apparatus further comprises an envelope shaper configured to shape the composite envelope. The apparatus further comprises an envelope splitter configured to split the shaped composite envelope into baseband versions of shaped envelope portions belonging to the multiple carriers. The frequency positioner is further configured to reposition the baseband version of each shaped envelope portion such that a frequency spacing between adjacent repositioned envelope portions is equal to that between corresponding adjacent carriers.

In an embodiment of the disclosure, the apparatus further comprises an envelope filter configured to filter the baseband version of each shaped envelope portion before the repositioning thereof.

In an embodiment of the disclosure, the apparatus further comprises a controller configured to determine whether the filtered baseband version of each shaped envelope portion satisfies a predetermined envelope shaping level. The controller is further configured to, when determining that the filtered baseband version of a shaped envelope portion does not satisfy the predetermined envelope shaping level, cause the frequency positioner, the envelope combiner, the envelope shaper, the envelope splitter and the envelope filter to operate iteratively until the controller determines that the filtered baseband version of each shaped envelope portion satisfies the predetermined envelope shaping level.

In an embodiment of the disclosure, the baseband version of each envelope portion is positioned with a first predetermined frequency spacing.

In an embodiment of the disclosure, the first predetermined frequency spacing is set to prevent third order intermodulation products due to the shaping from falling inside frequency ranges of the positioned envelope portions.

In an embodiment of the disclosure, the composite envelope is a baseband version centered at zero frequency or a value near zero frequency.

In an embodiment of the disclosure, the baseband version of each shaped envelope portion is filtered by converting the baseband version of the shaped envelope portion from time domain into frequency domain, filtering out envelope shaping distortion outside the bandwidth of the shaped envelope portion in frequency domain, adding filtered envelope shaping distortion to the base band version of the shaped envelope portion in frequency domain, and converting the baseband version of the shaped envelope portion from frequency domain into time domain.

In an embodiment of the disclosure, the frequency positioner comprises an NCO and a complex multiplier. The envelope combiner comprises a complex adder.

In an embodiment of the disclosure, the envelope combiner is further configured to recombine the repositioned envelope portions into a target composite envelope.

According to another aspect of the disclosure, there is provided an envelope tracking transmitter. The envelope tracking transmitter comprises the apparatus according to the above aspect. The envelope tracking transmitter further comprises a digital to analog converter (DAC) configured to convert the target composite envelope to a target analog envelope. The envelope tracking transmitter further comprises a power amplifier configured to amplify a radio frequency signal resulting from the multi-carrier signal. The envelope tracking transmitter further comprises a power supply configured to supply to the power amplifier an operation voltage corresponding to the target analog envelope.

According to another aspect of the disclosure, there is provided a radio frequency device comprising the envelope tracking transmitter according to the above aspect.

According to some embodiment(s) of the disclosure, the sampling rate for concurrent multiband envelope shaping process can be reduced and the computing resource usage and accuracy can be improved.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

The challenge to an ET PA is that its performance is acceptable for 3G code division multiple access (CDMA) systems but it may exhibit poor performance when used in conjunction with OFDM signals, given the stringent error vector magnitude (EVM) requirements specified in 3GPP standard and high PAPR signal characteristics.

Figure 1:
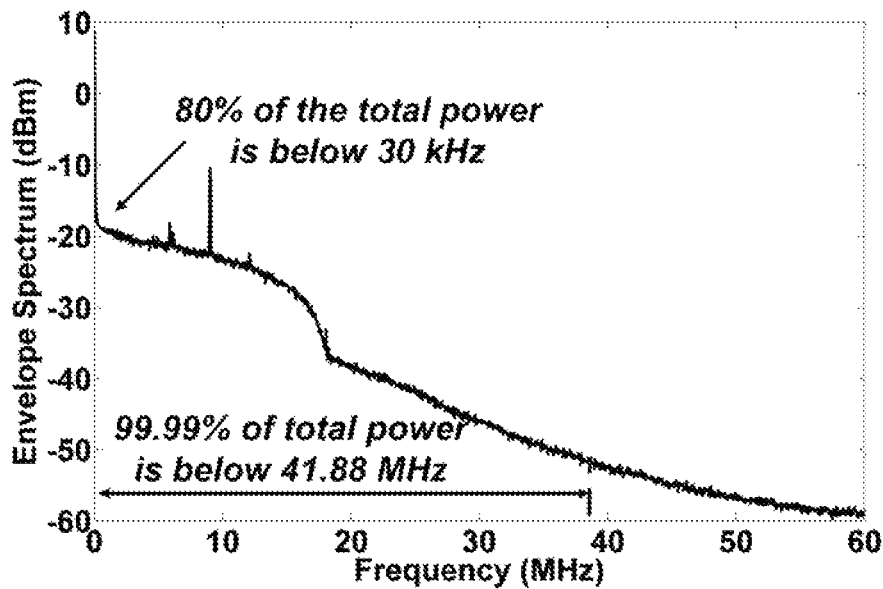
FIG. 1 shows instantaneous envelope bandwidth of a downlink LTE signal.

The main problem of the existing envelope shaping methods is that they may be difficult to realize concurrent multi-band envelope signal shaping due to extremely high computing resource required. The reason is that in baseband processing, the sampling rate for complex baseband envelope must be as high as the instantaneous envelope bandwidth (IEBW) and is wide according to the well-known Nyquist sampling theorem. The IEBW is defined as the total bandwidth encompassing all the carriers' envelopes intended for transmission. For example, FIG. 1 shows the IEBW of a downlink LTE signal with 20 MHz bandwidth. As shown, 80% of the total power of the downlink LTE signal is below 30 kHz and 99.99% of the total power is below 41.88 MHz.

For a single carrier signal having a smaller channel bandwidth (CBW), it does not require significant signal processing speed for IEBW as well. However, when a signal to be transmitted includes multiple carrier bands separated by a significant frequency bandwidth, for example 20-100 times the CBW, the IEBW quickly becomes a detrimental factor in signal processing speed for envelope shaping. For example, in concurrent multiband signals in 4G and beyond, widely-separated carriers, for example, those having a carrier center frequency separation of much greater than twice the channel bandwidth of the carrier bands, require processing speed which is not practical for existing hardware.

Figure 2A:
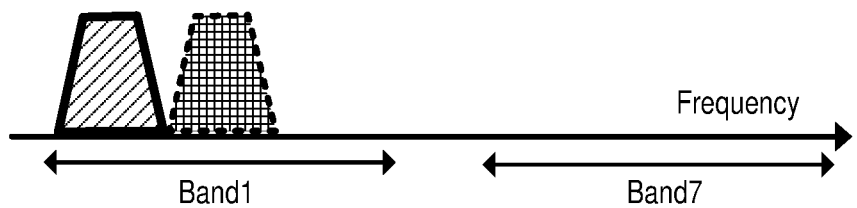
FIGS. 2A-2C show three different modes of carrier aggregation.
Figure 2B:
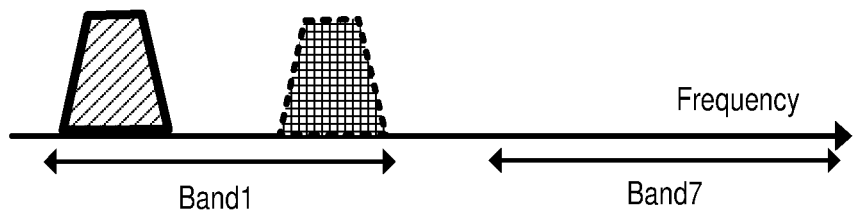
Figure 2C:
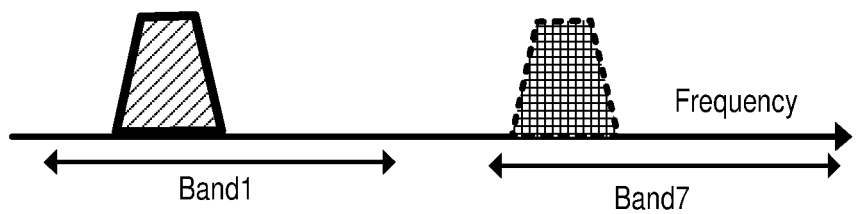

For helping understand the multi-band signal challenge, FIGS. 2A-2C show three different modes of carrier aggregation in LTE-advanced (LTE-A) system. The LTE-A system requires adoption of carrier aggregation techniques to increase the bandwidth and data rate of a communication link. The carrier aggregation techniques may incorporate multiple carriers over a wide frequency spectrum to deploy a wider bandwidth of up to 100 MHz. As shown, FIG. 2B (intra-band non-contiguous carrier aggregation) and FIG. 2C (inter-band carrier aggregation) may require much higher sampling speed than FIG. 2A (intra-band contiguous carrier aggregation) when the carrier spacing is sufficiently large. FIG. 2C indicates the concurrent multiband situation. For transmitters and ET PAs to accommodate the scenario of FIG. 2C, they will need to concurrently transmit multi-band signals under various power and frequency scenarios.

Figure 3A:
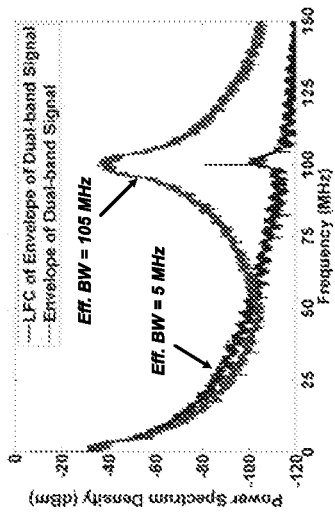
FIGS. 3A-3D show a dual-band envelope and a triple-band envelope in time domain and their envelope spectrums.
Figure 3B:
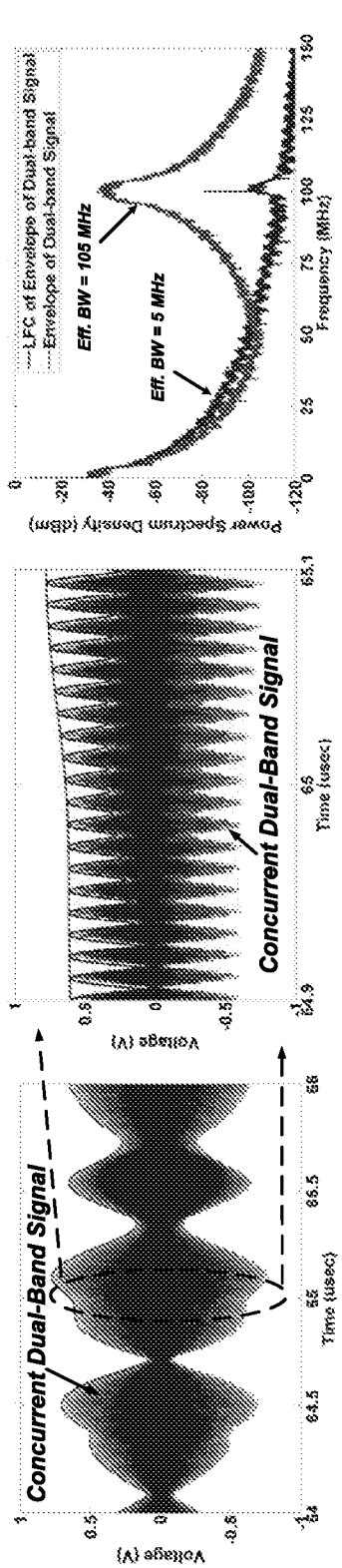
Figure 3C:
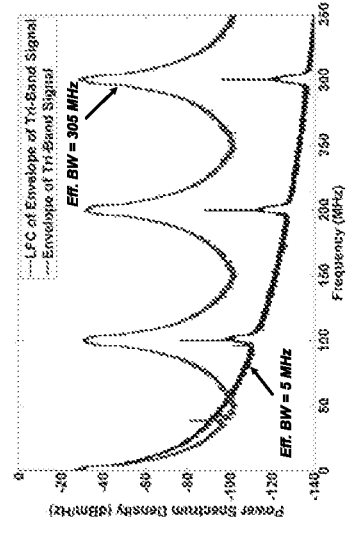
Figure 3D:
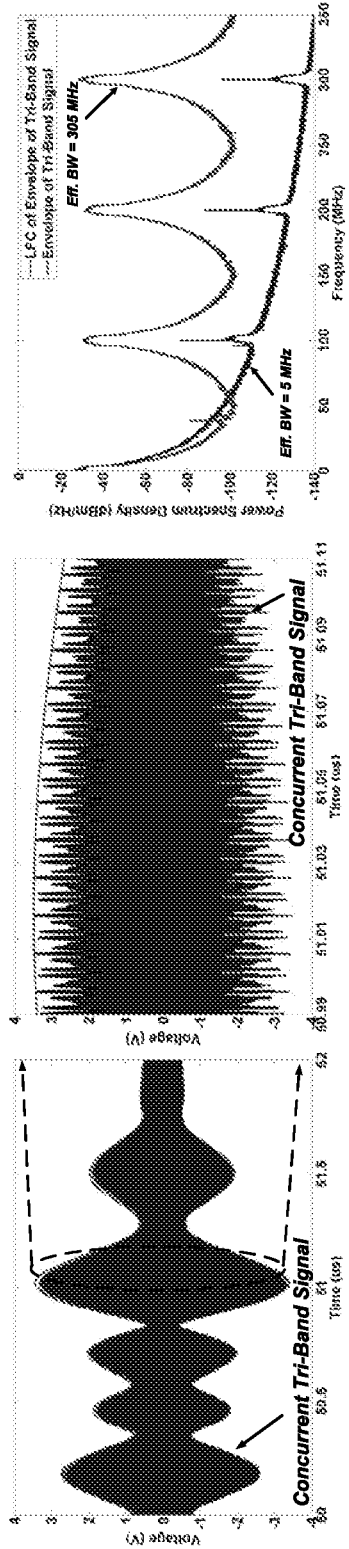

For helping understand the scenario of FIG. 2C, FIGS. 3A-3D show a dual-band envelope and a triple-band envelope in time domain and their envelope spectrums. FIG. 3A shows the time domain envelope of a dual-band signal having 5 MHz instantaneous bandwidth (IBW) and 100 MHz carrier spacing. FIG. 3B shows the frequency domain envelope of the dual-band signal. As indicated by the envelope spectrum and its low frequency component (LFC), the effective bandwidth of the envelope spectrum is 105 MHz and the effective bandwidth of a carrier signal is 5 MHz. FIG. 3C shows the time domain envelope of a triple-band signal having 5 MHz IBW and 100 MHz carrier spacing. FIG. 3D shows the frequency domain envelope of the triple-band signal. As indicated by the envelope spectrum and its LFC, the effective bandwidth of the envelope spectrum is 305 MHz and the effective bandwidth of a carrier signal is 5 MHz. Therefore, under concurrent multiband multi-carrier stimuli which may contain at least two or more carriers, the bandwidth of envelope spectrums of the stimuli would be dramatically increased.

As an exemplary example of FIG. 2C, a widely-separated carrier signal including simultaneous transmission into 3GPP Band 1 (2110-2170 MHz) and Band 7 (2620-2690) means a maximum frequency separation of 580 MHz between the bands if an LTE carrier channel bandwidth of 20 MHz is used. For this example, a matching sampling rate and processing speed of at least 1160 MHz would be required for envelope shaping. Therefore, the processing speed would exceed most hardware capabilities currently available.

Figure 4:
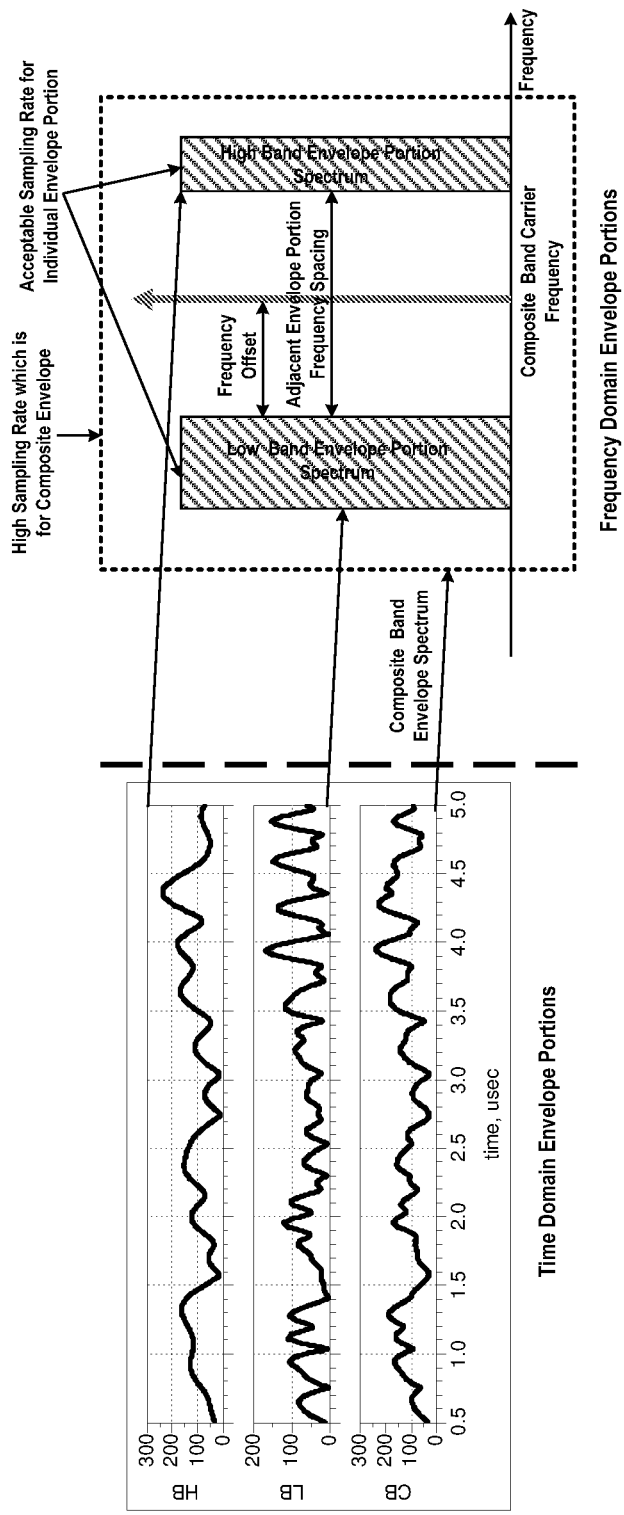
FIG. 4 shows an exemplary concurrent dual-band envelope in both time and frequency domain.

FIG. 4 shows an exemplary concurrent dual-band envelope in both time and frequency domain. The left side of FIG. 4 shows the time domain envelopes, where "HB" and "LB" refer to high band envelope portion and low band envelope portion which may have different modulation bandwidths, and "CB" refers to the composite envelope of the high band and low band envelope portions. The right side of FIG. 4 shows the frequency domain envelope, where the high band envelope portion and the low band envelope portion are separated by a frequency spacing indicated as "adjacent envelope portion frequency spacing" and the low band envelope portion has a frequency offset relative to zero frequency. According to prior arts, the composite envelope may undergo de-trough shaping overall, which may require a very high sampling rate because the frequency spacing between the adjacent envelope portions is large. Performing individual de-trough shaping on the two envelope portions requires a low sampling rate, depending on their individual modulation bandwidths. However, performing solely envelope shaping for each of multiple (e.g., greater than or equal to two) envelope portions may also require tremendous hardware computing resource.

That is, although separate envelope shaping may be performed on individual ones of the multiple carriers at a low speed, it requires a non-optimal implementation step and introduces high signal latency and increased complexity. Thus, envelope shaping has to be made on the combined signal to be effective. However, existing approaches may require a very high sampling speed to work over the entire multi-carrier or combined signal.

The present disclosure proposes an improved solution for envelope shaping of a multi-carrier signal in envelope tracking transmission. The principle of the disclosure can be applied not only to 4G LTE-A system mentioned above, but also to future OFDM based wireless system including WLAN and 5G. Hereinafter, the solution will be described in detail with reference to FIGS. 5-12.

Figure 5:
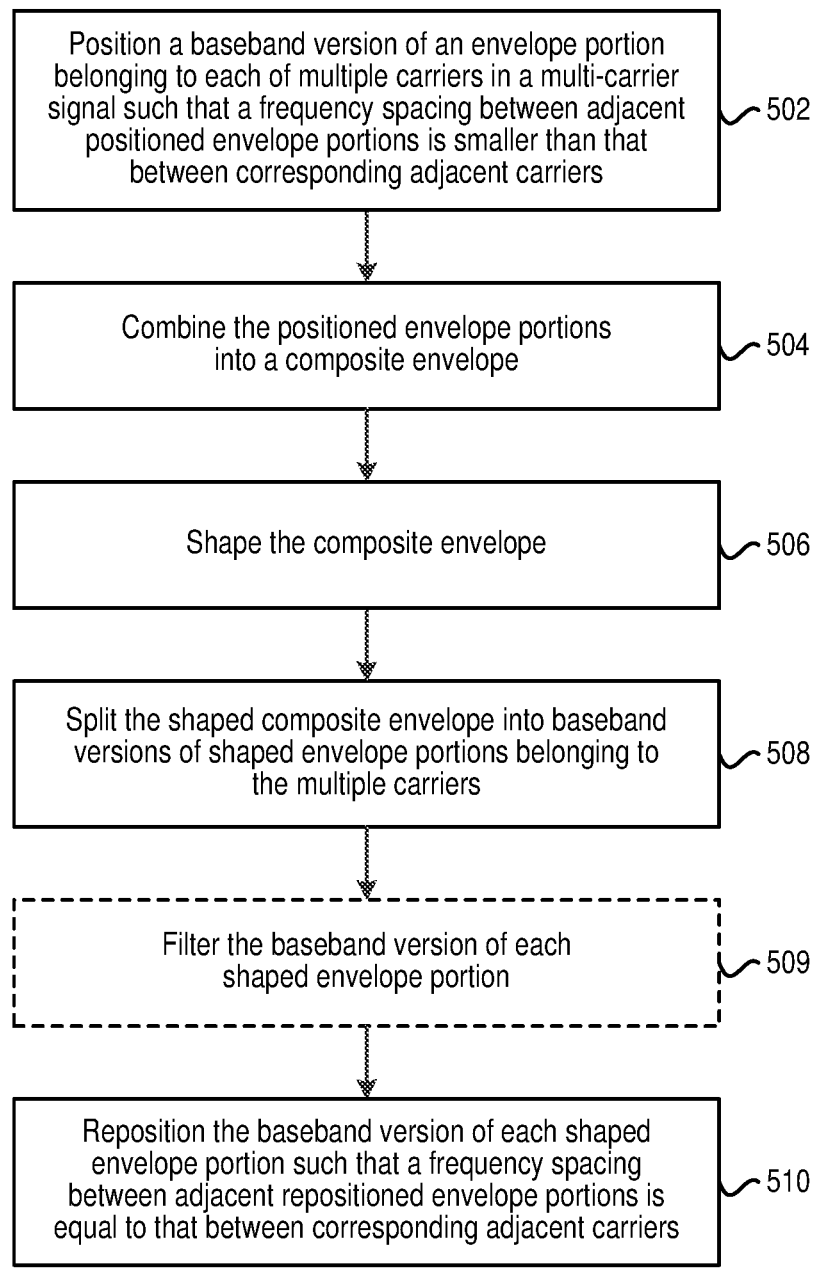
FIG. 5 is a flowchart illustrating a method for envelope shaping according to an embodiment of the disclosure.

FIG. 5 is a flowchart illustrating a method for envelope shaping of a multi-carrier signal according to an embodiment of the disclosure. At block 502, a baseband version of an envelope portion belonging to each of multiple carriers in the multi-carrier signal is positioned such that a frequency spacing between adjacent positioned envelope portions is smaller than that between corresponding adjacent carriers. The baseband version of an envelope portion may refer to that this version is centered at zero frequency or a value near zero frequency. For each carrier in the multi-carrier signal, the baseband version of an envelope portion belonging to the carrier may be extracted as $V_{env}$ by the equation:

$$V_{env} = \sqrt{I_{data}^2 + Q_{data}^2},$$

where $I_{data}$ represents the in-phase (I phase) component of a complex baseband signal for the carrier and $Q_{data}$ represents the quadrature (Q phase) component of the complex baseband signal for the carrier. The baseband version of each envelope portion may be positioned by using various frequency shifting techniques such as analog RF frequency conversion, digital complex frequency tuning, or a combination of both. As an exemplary example, the frequency positioning of the envelope portions may be performed by complex numerically controlled oscillator (NCO) multiplication.

Figure 7A:
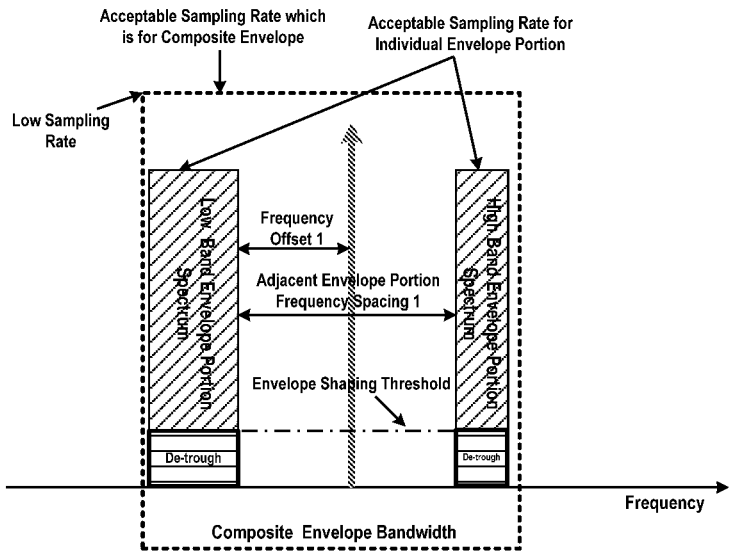
FIGS. 7A-7B show an exemplary example for the envelope shaping process according to an embodiment of the disclosure.
Figure 7B:
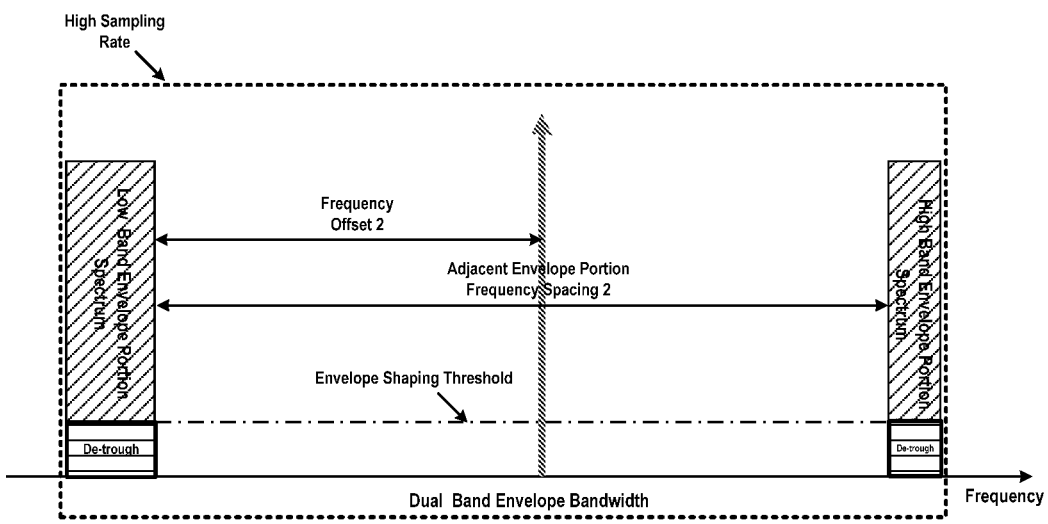

Take a dual-band envelope as an example. The effect brought by the positioning may be as shown in FIGS. 7A-7B which will be described later. In FIG. 7B, the low band envelope portion and the high band envelope portion are separated by a frequency spacing indicated as "adjacent envelope portion frequency spacing 2" which is also the frequency spacing between the adjacent carriers in the dual-band signal. Thus, it requires a high sampling rate for envelope shaping of the composite envelope. In contrast, in FIG. 7A, due to the positioning at block 502, the low band envelope portion and the high band envelope portion are separated by a frequency spacing indicated as "adjacent envelope portion frequency spacing 1", which is smaller than the frequency spacing between the adjacent carriers. Thus, it requires a low sampling rate for envelope shaping of the composite envelope.

As an example, the baseband version of each envelope portion may be positioned with a first predetermined frequency spacing. The first predetermined frequency spacing may be set to prevent third order intermodulation products due to the shaping (described later for block 506) from falling inside frequency ranges of the positioned envelope portions. As another example, the positioning of the baseband versions may be performed with a non-uniform frequency spacing that is greater than or equal to the first predetermined frequency spacing. In other words, the input carriers are positioned at a predetermined frequency separation which is sufficiently large frequency spacing that avoids frequency aliasing for sampling speed. This establishes a temporary frequency separation that only exists when calculating the proper shaping distortion to be added to each envelope portion.

Figure 6A:
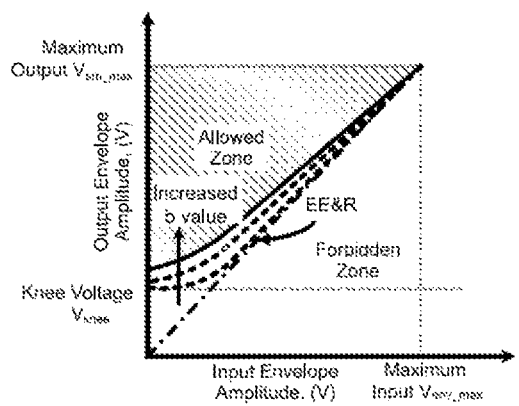
FIGS. 6A-6D show transfer functions of different envelope shaping techniques and their effects on time domain envelope waveforms.
Figure 6B:
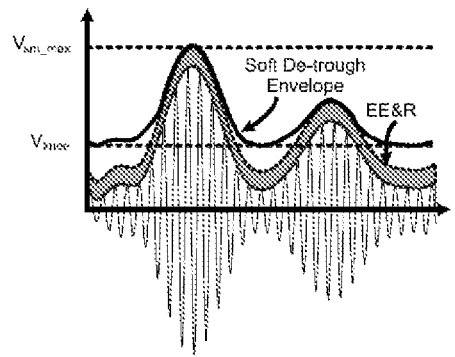

At block 504, the positioned envelope portions are combined into a composite envelope. For example, the composite envelope may be centered at zero frequency or a value near zero frequency. The combination into the composite envelope may be performed by complex addition of the frequency-shifted envelope portions. At block 506, the composite envelope is shaped. As an example, the shaping may be performed by using soft de-trough shaping. FIG. 6A shows the transfer function of soft de-trough shaping and FIG. 6B shows the effect of soft de-trough shaping on a time domain envelope waveform. Note that the transfer function and the effect of envelope elimination and restoration (EE&R) technique is also shown as a reference for comparison. A typical soft de-trough equation as given below may be used to shape the composite envelope:

$$V_{env\_shaped}(t) = V_{sm\_max} \cdot (V_{env}(t)/V_{env\_max} + b \cdot e^{-V_{env}(t)/(V_{env\_max})/b})$$

where $V_{env\_shaped}(t)$ is the shaped envelope signal, $V_{sm\_max}$ is the maximum supply voltage for a PA, $V_{env}(t)$ is the input envelope signal with maximum magnitude $V_{env\_max}$, and b is a de-trough factor. As shown in FIG. 6A, by increasing the value of b, the minimum amplitude of the shaped envelope signal is made greater than the knee voltage $V_{knee}$ of the PA.

Figure 6C:
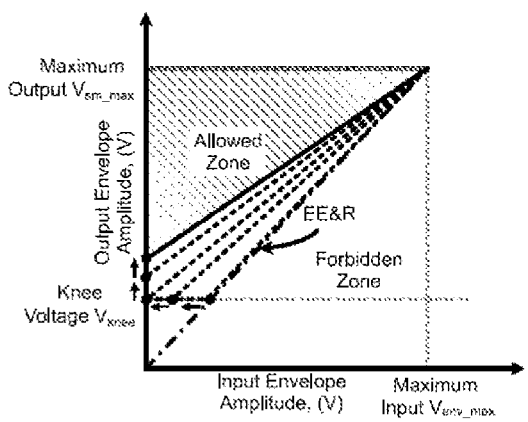
Figure 6D:
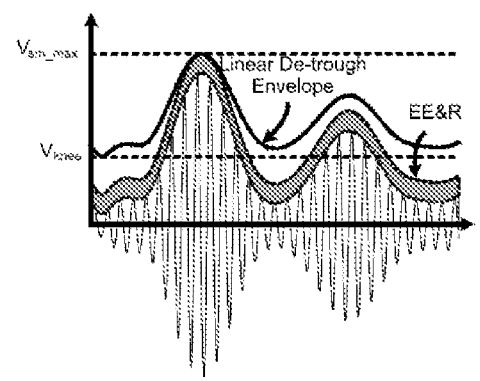

As another example, the shaping may be performed by using linear de-trough shaping. FIG. 6C shows the transfer function of linear de-trough shaping and FIG. 6D shows the effect of linear de-trough shaping on a time domain envelope waveform. As shown, the transfer function of linear de-trough shaping defines an optimum offset voltage to the original envelope signal for linearity. This does not change the envelope bandwidth because it is a linear scaling operation to reduce the PAPR of the envelope. When the knee voltage $V_{knee}$ is constant over the entire operating range, the offset voltage may be preferred to be equal to the knee voltage. Otherwise, the highest knee voltage across the operating range may be used as the offset value to cover all scenarios to guarantee removing the supply voltage swing into the knee region. The shaped envelope signal may be expressed as:

$$V_{env\_shaped}(t) = ((V_{sm\_max} - V_{knee})/V_{env\_max}) \cdot V_{env}(t) + V_{knee} = k \cdot V_{env}(t) + V_{knee}$$

where $V_{env\_shaped}(t)$ is the shaped envelope signal, $V_{sm\_max}$ is the maximum supply voltage for a PA, $V_{knee}$ is the knee voltage of the PA, $V_{env}(t)$ is the input envelope signal with maximum magnitude $V_{env\_max}$, and k is the slope of linear de-trough shaping.

It should be noted that the present disclosure is not limited to the above examples. Any other suitable envelope de-trough shaping techniques, such as hard de-trough shaping, Nujira Wilson shaping, Nujira N=6 shaping, or the like, may also be used to perform the shaping. Also note that the envelope shaping may be performed on either the composite envelope or the individual envelope portion depending on the frequency spacing between individual carriers.

At block 508, the shaped composite envelope is split (or broken down) into baseband versions of shaped envelope portions belonging to the multiple carriers. when viewed in frequency domain, if the envelope portion for a carrier is shifted by a frequency offset at block 502, then the shaped composite envelope may be shifted by an opposite value of the frequency offset to obtain the baseband version of the shaped envelope portion for the carrier. The frequency shifting by the opposite value may be performed by various frequency shifting techniques such as analog RF frequency conversion, digital complex frequency tuning, or a combination of both. As an exemplary example, the frequency shifting by the opposite value may be performed by complex numerically controlled oscillator (NCO) multiplication.

At block 510, the baseband version of each shaped envelope portion is repositioned such that a frequency spacing between adjacent repositioned envelope portions is equal to that between corresponding adjacent carriers. In other words, another frequency shift to the shaped envelope portion is performed such that the frequency-shifted shaped envelope portions are widely separated to frequency positions constituting separate operating frequency bands according to a multi-band configuration. Similar to block 502, the baseband version of each shaped envelope portion may be repositioned by using various frequency shifting techniques such as analog RF frequency conversion, digital complex frequency tuning, or a combination of both. As an exemplary example, the frequency repositioning of the shaped envelope portions may be performed by complex numerically controlled oscillator (NCO) multiplication.

FIGS. 7A-7B show an exemplary example for the envelope shaping process according to an embodiment of the disclosure. As shown in FIG. 7A, a high frequency (HF) envelope portion spectrum and a lower frequency (LF) envelope portion spectrum are plotted for a dual-band signal. Each envelope portion has a center frequency and a channel bandwidth (CBW). Both the HF and LF envelope portions are positioned at a predetermined center frequency separation with frequency spacing 1 and frequency offset 1. They are shaped by de-trough operation as a composite envelope (combined HF and LF envelope portions) with a low sampling rate. FIG. 7B shows that the post-shaped HF and LF envelope portions, including de-trough shaping distortion, are repositioned to a dual band frequency spacing 2 with a widely-separated envelope portion configuration.

According to the method described above, the frequency spacing between the adjacent envelope portions is narrowed down as an intermediate stage of the envelope shaping to group as many envelope portions as possible for one shaping with acceptable hardware resource and sampling rate. In this way, the sampling rate for concurrent multiband envelope shaping process can be reduced and the computing resource usage and accuracy can be improved. Furthermore, since the shaped envelope properties from the envelope shaping can be preserved when going from the composite envelope configuration to the actual concurrent multi-band configuration, the required sampling speed for the envelope shaping is not at all dependent on the setting of the actual multi-band configuration, and a sampling speed commensurate with the high IEBW is not required.

When the envelope shaping has been performed, the shaping distortion may be retained within respective modulation bandwidths of the multiple carriers. Thus, filtering envelope shaping distortion outside the channel bandwidth of each envelope portion may be needed to eliminate emissions. In view of this, optionally, at block 509, the baseband version of each shaped envelope portion is filtered before the repositioning thereof. In this way, it can minimize the intermodulation (IM) impact and distortions that may be coupled to the ET PA's final output via supply modulation scheme.

For example, the filtering may be performed when it is recognized that the envelope shaping produces unwanted clipping distortion outside the envelope portion bandwidth. As an option, the filtering may be performed by using low pass filtering. As another option, the filtering process may be implemented by four sub-blocks. At the first sub-block, the baseband version of each shaped envelope portion may be converted from time domain into frequency domain. At the second sub-block, envelope shaping distortion outside the bandwidth of each carrier's envelope portion may be filtered out. At the third sub-block, filtered envelope shaping distortion may be added to the baseband version of each carrier's envelope portion. At the fourth sub-block, the baseband version of each shaped envelope portion may be converted from frequency domain into time domain. The details of these four sub-blocks may be found from WO2016/081250A1, which is incorporated here by reference in its entirety.

Figure 8:
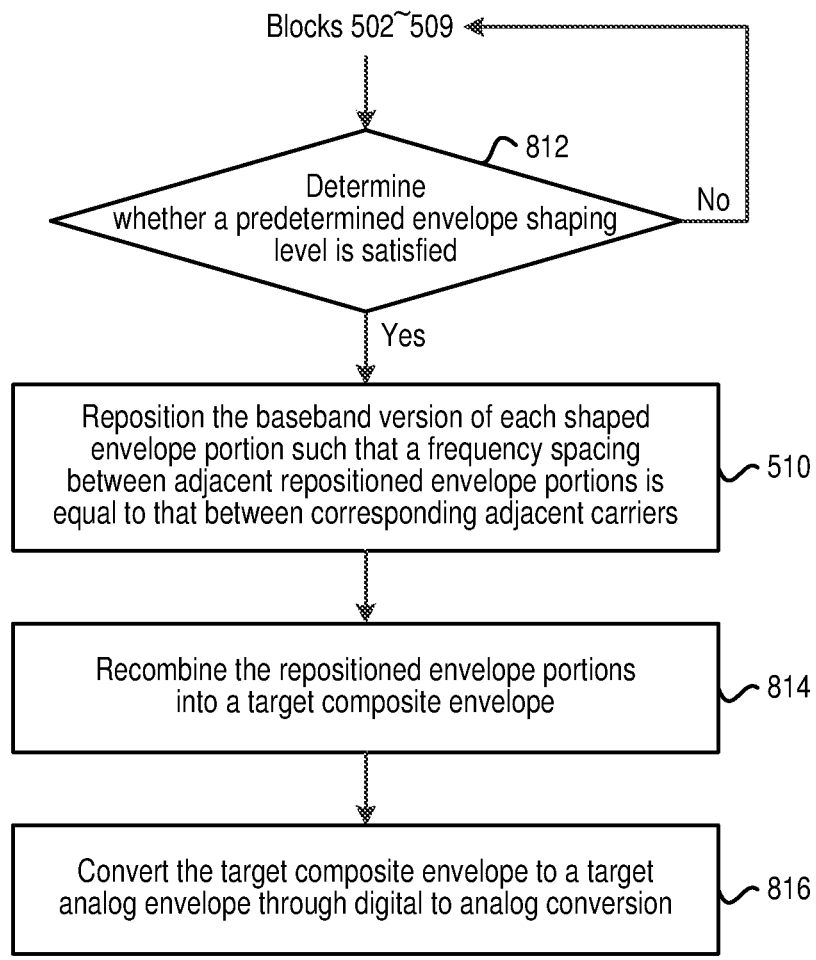
FIG. 8 is a flowchart illustrating a method for envelope shaping according to another embodiment of the disclosure.

FIG. 8 is a flowchart illustrating a method for envelope shaping according to another embodiment of the disclosure. As shown, in this method, blocks 502-509 of FIG. 5 are performed. Then, at block 812, it is determined whether the filtered baseband version of each shaped envelope portion satisfies a predetermined envelope shaping level. For example, the predetermined envelope shaping level may be set according to a tradeoff between the linearity and efficiency of the power amplifier that employs envelope tracking. If it is determined that the filtered baseband version of a shaped envelope portion does not satisfy the predetermined envelope shaping level at block 812, blocks 502-509 and 812 (the positioning, the combining, the shaping, the splitting, the filtering and the determining) are performed iteratively until it is determined that the filtered baseband version of each shaped envelope portion satisfies the predetermined envelope shaping level at block 812. In this way, a smoother implementation in terms of signal reshaping and re-settled amplitudes may be achieved via the iteration.

At block 510, the baseband version of each shaped envelope portion is repositioned such that a frequency spacing between adjacent repositioned envelope portions is equal to that between corresponding adjacent carriers. This block has been described above with respect to FIG. 5. At block 814, the repositioned envelope portions are recombined into a target composite envelope. Similar to block 504, the re-combination may be performed by complex addition of the re-positioned envelope portions. At block 816, the target composite envelope is converted to a target analog envelope through digital to analog conversion. The target analog envelope may be used for envelope tracking amplification, which will be described later. It should be noted that two blocks shown in succession may, in fact, be executed substantially concurrently, or the blocks may sometimes be executed in the reverse order, depending upon the functionality involved.

Figure 9:
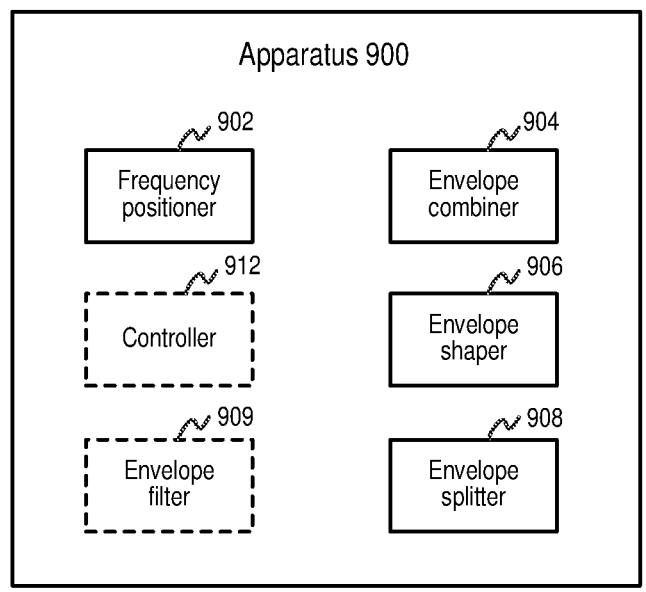
FIG. 9 is a block diagram showing an apparatus for envelope shaping according to an embodiment of the disclosure.

FIG. 9 is a block diagram showing an apparatus for envelope shaping according to an embodiment of the disclosure. For example, the apparatus may be a digital front end of an envelope tracking transmitter and be implemented as various integrated circuits such as digital signal processor (DSP), field programmable gate array (FPGA), or the like. As shown, the apparatus 900 comprises a frequency positioner 902, an envelope combiner 904, an envelope shaper 906 and an envelope splitter 908. The frequency positioner 902 is configured to position a baseband version of an envelope portion belonging to each of multiple carriers in the multi-carrier signal such that a frequency spacing between adjacent positioned envelope portions is smaller than that between corresponding adjacent carriers. The frequency positioner 902 may be implemented as described above with respect to block 502 of FIG. 5. Note that the circuit for generating the complex baseband signal for each carrier may be or may not be a component of the frequency positioner 902. The envelope combiner 904 is configured to combine the positioned envelope portions into a composite envelope. The envelope combiner 904 may be implemented as described above with respect to block 504 of FIG. 5. The envelope shaper 906 is configured to shape the composite envelope. The envelope shaper 906 may be implemented as described above with respect to block 506 of FIG. 5. The envelope splitter 908 is configured to split the shaped composite envelope into baseband versions of shaped envelope portions belonging to the multiple carriers. The envelope splitter 908 may be implemented as described above with respect to block 508 of FIG. 5. The frequency positioner 902 is further configured to reposition the baseband version of each shaped envelope portion such that a frequency spacing between adjacent repositioned envelope portions is equal to that between corresponding adjacent carriers. The repositioning may be implemented as described above with respect to block 510 of FIG. 5.

As shown in FIG. 9, the apparatus 900 may optionally comprise an envelope splitter 909 and a controller 912. The envelope filter 909 may be configured to filter the baseband version of each shaped envelope portion before the repositioning thereof. The envelope filter 909 may be implemented as described above with respect to block 509 of FIG. 5. The controller 912 may be configured to determine whether the filtered baseband version of each shaped envelope portion satisfies a predetermined envelope shaping level. The controller 912 may be further configured to, when determining that the filtered baseband version of a shaped envelope portion does not satisfy the predetermined envelope shaping level, cause the frequency positioner 902, the envelope combiner 904, the envelope shaper 906, the envelope splitter 908 and the envelope filter 909 to operate iteratively until the controller 912 determines that the filtered baseband version of each shaped envelope portion satisfies the predetermined envelope shaping level. The controller 912 may be implemented as described above with respect to block 812 of FIG. 8. Optionally, the envelope combiner 904 may be further configured to recombine the repositioned envelope portions into a target composite envelope. The recombination may be implemented as described above with respect to block 814 of FIG. 8.

Figure 10:
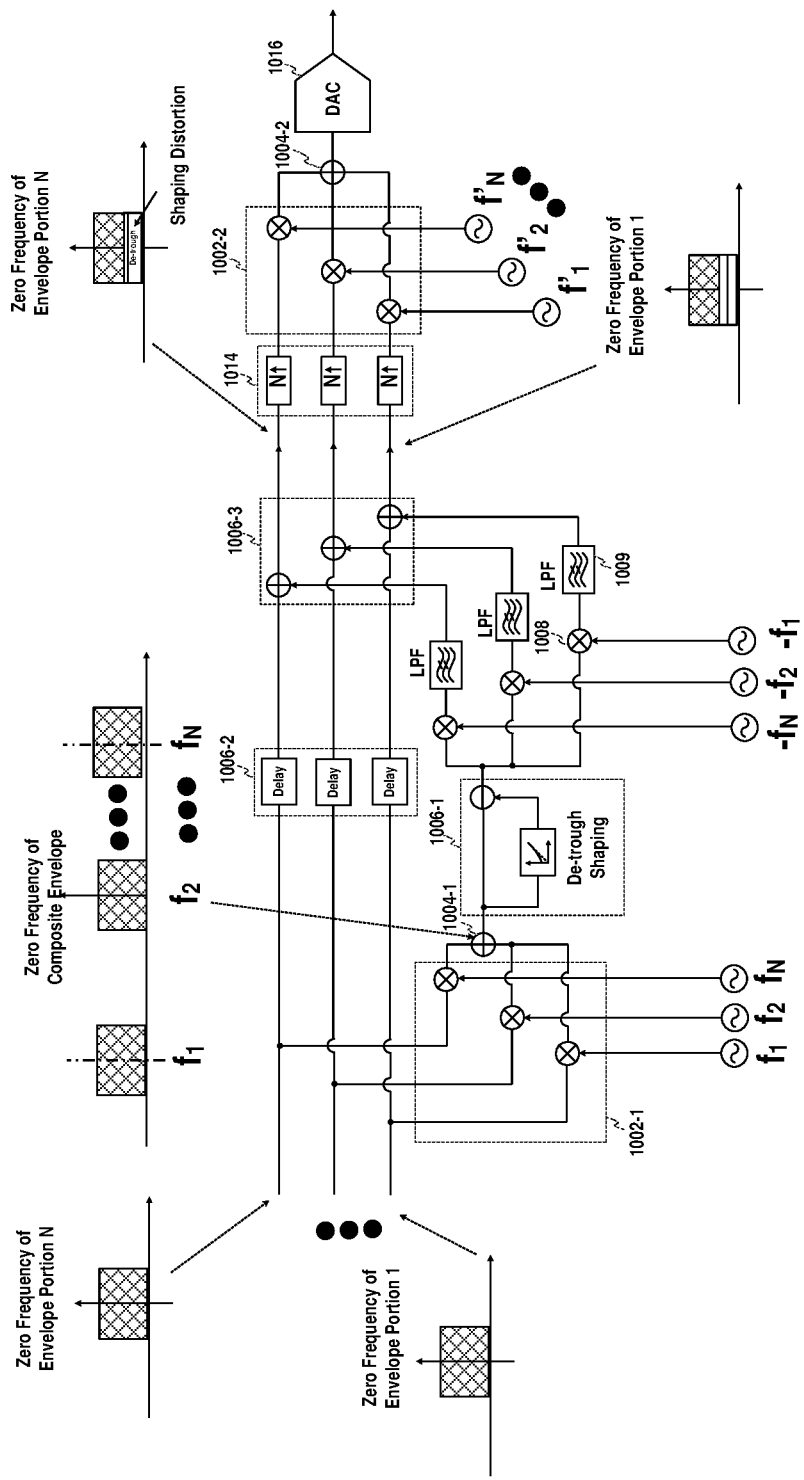
FIG. 10 is a diagram showing an envelope shaping circuit according to an embodiment of the disclosure.

FIG. 10 is a diagram showing an envelope shaping circuit according to an embodiment of the disclosure. The envelope shaping circuit may be used for implementing the apparatus 900 in concurrent N-band scenario. In the example shown in FIG. 10, the frequency positioner 902 is implemented as a number N of digital complex frequency converter 1002-1 for positioning the baseband versions of envelope portions by frequency offsets ($f_1, f_2, \ldots, f_N$), and a number N of digital complex frequency converter 1002-2 for repositioning the filtered baseband versions of shaped envelope portions by frequency offsets ($f'_1, f'_2, \ldots, f'_N$). The envelope combiner 904 is implemented as a complex adder 1004-1 for combining the positioned envelope portions, and a complex adder 1004-2 for recombining the repositioned envelope portions. The envelope shaper 906 is implemented as a de-trough shaping component 1006-1, a number N of delay components 1006-2 and a number N of complex adders 1006-3. The envelope splitter 908 is implemented as a number N of digital complex frequency converters 1008 for applying frequency offsets ($-f_1, -f_2, \ldots, -f_N$) to the de-trough shaped signal. The envelope filter 909 is implemented as a number N of low pass filters 1009.

The delay component 1006-2 may apply a corresponding delay to the baseband version of an envelope portion such that the delayed baseband version of the envelope portion and the filtered baseband version of the de-trough shaped signal are in phase synchronization with each other. Then, the complex adder 1006-3 may subtract the filtered baseband version of the de-trough shaped signal from the delayed baseband version of the envelope portion to obtain the filtered baseband version of the shaped envelope portion. As shown, the envelope shaping circuit further comprises a number N of digital up-sampling components 1014 and a digital to analog converter (DAC) 1016. After passing through the digital up-sampling components 1014, the digital complex frequency converter 1002-2 and the complex adder 1004-2, the DAC 1016 may accomplish the analog envelope generation.

In FIG. 10, the individual envelope portions may be positioned or arranged into a composite configuration with enough spacing between the adjacent envelope portions in order not to allow third order IM products from the de-trough envelope shaping operation to fall inside the frequency ranges of any of the other envelope portions. The total IEBW for the concurrent multi-band configuration thus sets the minimum sampling speed of the digital front end required for the concurrent multi-band envelope shaping.

Figure 11:
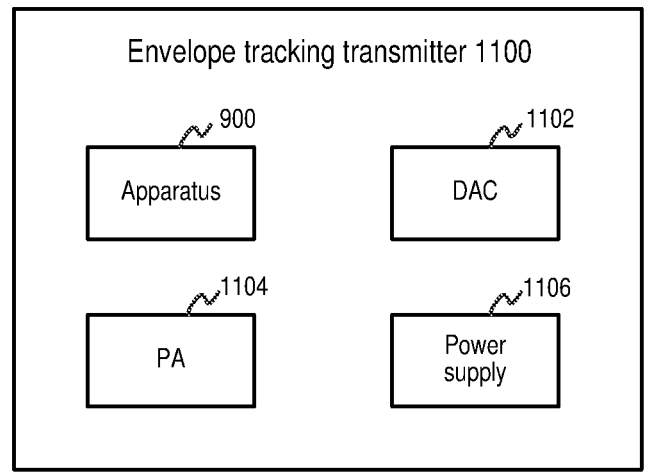
FIG. 11 is a block diagram showing an envelope tracking transmitter according to an embodiment of the disclosure.

FIG. 11 is a block diagram showing an envelope tracking transmitter according to an embodiment of the disclosure. As shown, the envelope tracking transmitter 1100 comprises the apparatus 900 described above, a DAC 1102, a power amplifier 1104 and a power supply 1107. The DAC 1102 is configured to convert the target composite envelope to a target analog envelope. The power amplifier 1104 is configured to amplify a radio frequency signal resulting from the multi-carrier signal. The power supply 1106 is configured to supply to the power amplifier an operation voltage corresponding to the target analog envelope. Note that the present disclosure is not limited in the implementation of the power amplifier 1104 and the power supply 1106. Various envelope tracking techniques may be used for their implementation.

Figure 12:
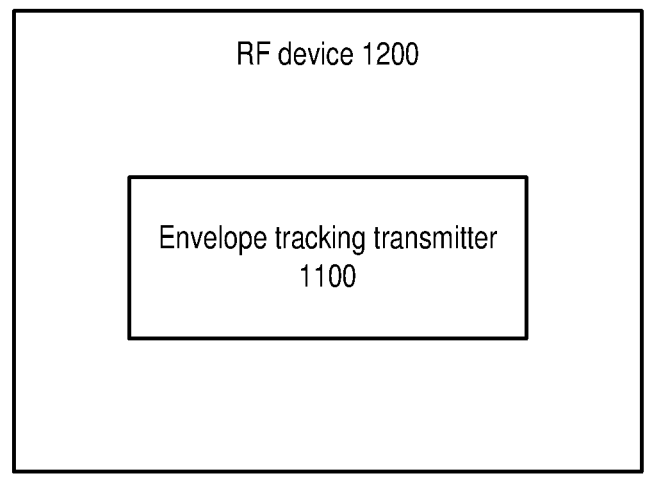
FIG. 12 is a block diagram showing a RF device according to an embodiment of the disclosure.

FIG. 12 is a block diagram showing a RF device according to an embodiment of the disclosure. As shown, the RF device 1200 comprises the envelope tracking transmitter 1100 described above. As an example, the RF device 1200 may be a base station such as evolved Node B (eNB), gNB, or the like. As another example, the RF device 1200 may be a user equipment (UE). The UE may also be referred to as, for example, mobile station, mobile unit, subscriber station, access terminal, terminal device, or the like. It may refer to any end device that can access a wireless communication network and receive services therefrom. By way of example and not limitation, the UE may include portable computers, image capture terminal devices such as digital cameras, gaming terminal devices, music storage and playback appliances, a mobile phone, a cellular phone, a smart phone, a tablet, a wearable device, a personal digital assistant (PDA), or the like.

In an Internet of things (IoT) scenario, a UE may represent a machine or other device that performs monitoring and/or measurements, and transmits the results of such monitoring and/or measurements to another UE and/or a network equipment. In this case, the UE may be a machine-to-machine (M2M) device, which may, in a 3GPP context, be referred to as a machine-type communication (MTC) device. Particular examples of such machines or devices may include sensors, metering devices such as power meters, industrial machinery, bikes, vehicles, or home or personal appliances, e.g. refrigerators, televisions, personal wearables such as watches, and so on.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A method for envelope shaping of a multi-carrier signal in envelope tracking transmission, the method comprising:
    positioning a baseband version of an envelope portion belonging to each of multiple carriers in the multi-carrier signal such that a frequency spacing between adjacent positioned envelope portions is smaller than that between corresponding adjacent carriers;
    combining the positioned envelope portions into a composite envelope;
    shaping the composite envelope;
    splitting the shaped composite envelope into baseband versions of shaped envelope portions belonging to the multiple carriers; and
    repositioning the baseband version of each shaped envelope portion such that a frequency spacing between adjacent repositioned envelope portions is equal to that between corresponding adjacent carriers.

2. The method according to claim 1, further comprising filtering the baseband version of each shaped envelope portion before the repositioning thereof.

3. The method according to claim 2, further comprising determining whether the filtered baseband version of each shaped envelope portion satisfies a predetermined envelope shaping level; and
    wherein when it is determined that the filtered baseband version of a shaped envelope portion does not satisfy the predetermined envelope shaping level, the positioning, the combining, the shaping, the splitting, the filtering and the determining are performed iteratively until it is determined that the filtered baseband version of each shaped envelope portion satisfies the predetermined envelope shaping level.

4. The method according to claim 2, wherein the baseband version of each shaped envelope portion is filtered by:
    converting the baseband version of the shaped envelope portion from time domain into frequency domain;
    filtering out envelope shaping distortion outside the bandwidth of the shaped envelope portion in frequency domain;

adding filtered envelope shaping distortion to the base band version of the shaped envelope portion in frequency domain; and converting the baseband version of the shaped envelope portion from frequency domain into time domain.

5. The method according to claim 1, wherein the baseband version of each envelope portion is positioned with a first predetermined frequency spacing.

6. The method according to claim 5, wherein the first predetermined frequency spacing is set to prevent third order intermodulation products due to the shaping from falling inside frequency ranges of the positioned envelope portions.

7. The method according to claim 1, wherein the composite envelope is a baseband version centered at zero frequency or a value near zero frequency.

8. The method according to claim 1, wherein the positioning and the repositioning are performed by complex numerically controlled oscillator, NCO, multiplication; and wherein the combining is performed by complex addition of the positioned envelope portions.

9. The method according to claim 1, further comprising:

recombining the repositioned envelope portions into a target composite envelope; and converting the target composite envelope to a target analog envelope through digital to analog conversion.

10. An apparatus for envelope shaping of a multi-carrier signal in envelope tracking transmission, the apparatus comprising:

a frequency positioner configured to position a baseband version of an envelope portion belonging to each of multiple carriers in the multi-carrier signal such that a frequency spacing between adjacent positioned envelope portions is smaller than that between corresponding adjacent carriers;

an envelope combiner configured to combine the positioned envelope portions into a composite envelope;

an envelope shaper configured to shape the composite envelope;

an envelope splitter configured to split the shaped composite envelope into baseband versions of shaped envelope portions belonging to the multiple carriers; and the frequency positioner being further configured to reposition the baseband version of each shaped envelope portion such that a frequency spacing between adjacent repositioned envelope portions is equal to that between corresponding adjacent carriers.

11. The apparatus according to claim 10, further comprising an envelope filter configured to filter the baseband version of each shaped envelope portion before the repositioning thereof.

12. The apparatus according to claim 11, further comprising a controller configured to determine whether the filtered baseband version of each shaped envelope portion satisfies a predetermined envelope shaping level; and wherein the controller is further configured to, when determining that the filtered baseband version of a shaped envelope portion does not satisfy the predetermined envelope shaping level, cause the frequency positioner, the envelope combiner, the envelope shaper, the envelope splitter and the envelope filter to operate iteratively until the controller determines that the filtered baseband version of each shaped envelope portion satisfies the predetermined envelope shaping level.

13. The apparatus according to claim 11, wherein the baseband version of each shaped envelope portion is filtered by:

converting the baseband version of the shaped envelope portion from time domain into frequency domain;

filtering out envelope shaping distortion outside the bandwidth of the shaped envelope portion in frequency domain;

adding filtered envelope shaping distortion to the base band version of the shaped envelope portion in frequency domain; and converting the baseband version of the shaped envelope portion from frequency domain into time domain.

14. The apparatus according to claim 10, wherein the baseband version of each envelope portion is positioned with a first predetermined frequency spacing.

15. The apparatus according to claim 14, wherein the first predetermined frequency spacing is set to prevent third order intermodulation products due to the shaping from falling inside frequency ranges of the positioned envelope portions.

16. The apparatus according to claim 10, wherein the composite envelope is a baseband version centered at zero frequency or a value near zero frequency.

17. The apparatus according to claim 10, wherein the frequency positioner comprises a numerically controlled oscillator, NCO, and a complex multiplier; and wherein the envelope combiner comprises a complex adder.

18. The apparatus according to claim 10, wherein the envelope combiner is further configured to recombine the repositioned envelope portions into a target composite envelope.

19. An envelope tracking transmitter comprising:

a frequency positioner configured to position a baseband version of an envelope portion belonging to each of multiple carriers in a multi-carrier signal such that a frequency spacing between adjacent positioned envelope portions is smaller than that between corresponding adjacent carriers;

an envelope combiner configured to combine the positioned envelope portions into a composite envelope;

an envelope shaper configured to shape the composite envelope;

an envelope splitter configured to split the shaped composite envelope into baseband versions of shaped envelope portions belonging to the multiple carriers;

the frequency positioner being further configured to reposition the baseband version of each shaped envelope portion such that a frequency spacing between adjacent repositioned envelope portions is equal to that between corresponding adjacent carriers, and the envelope combiner is further configured to recombine the repositioned envelope portions into a target composite envelope;

a digital to analog converter, DAC, configured to convert the target composite envelope to a target analog envelope;

a power amplifier configured to amplify a radio frequency signal resulting from the multi-carrier signal; and a power supply configured to supply to the power amplifier an operation voltage corresponding to the target analog envelope.

20. The envelope tracking transmitter according to claim 19, wherein the envelope tracking transmitter is comprised in a radio frequency device.

* * * * *